(12) United States Patent
Huang et al.

(10) Patent No.: US 10,634,728 B2
(45) Date of Patent: Apr. 28, 2020

(54) METHOD AND APPARATUS FOR DETECTING STATE OF BATTERY

(71) Applicant: Silergy Semiconductor Technology (Hangzhou) LTD, Hangzhou, ZheJiang Province (CN)

(72) Inventors: Xiaodong Huang, Hangzhou (CN); Hejinsheng Cao, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 293 days.

(21) Appl. No.: 15/618,329

(22) Filed: Jun. 9, 2017

(65) Prior Publication Data

US 2017/0370995 A1 Dec. 28, 2017

(30) Foreign Application Priority Data

Jun. 23, 2016 (CN) .......................... 2016 1 0467536

(51) Int. Cl.
*G01R 31/36* (2020.01)
*G01R 31/387* (2019.01)
*G01R 31/367* (2019.01)
*G01R 31/374* (2019.01)
*G01R 31/389* (2019.01)
*G01R 31/396* (2019.01)

(52) U.S. Cl.
CPC ......... *G01R 31/387* (2019.01); *G01R 31/367* (2019.01); *G01R 31/374* (2019.01); *G01R 31/389* (2019.01); *G01R 31/396* (2019.01)

(58) Field of Classification Search
CPC ...... G01R 31/00; G01R 31/36; G01R 31/367; G01R 31/374; G01R 31/382; G01R 31/3835; G01R 31/3842; G01R 31/385; G01R 31/387; G01R 31/388; G01R 31/389; G01R 31/392; G01R 31/396
USPC ................................ 324/425, 426, 428, 430
See application file for complete search history.

(56) References Cited

U.S. PATENT DOCUMENTS 5,672,951 A * 9/1997 Shiota .................. H02J 7/0078
320/132
6,160,382 A 12/2000 Yoon et al.
6,445,162 B1 * 9/2002 Mukainakano ....... H02J 7/0047
320/132

(Continued)

FOREIGN PATENT DOCUMENTS

CN 102621497 A 8/2012
CN 104502858 A 4/2015
CN 104991202 A 10/2015

OTHER PUBLICATIONS

Zhenqiang Li, Research on model parameters and charge state estimation of lithium battery, Jan. 2016, pp. 18-21,24, vol.-issue 1, Communication power technology, China.

*Primary Examiner* — Hoai-An D. Nguyen
(74) *Attorney, Agent, or Firm* — Michael C. Stephens, Jr.

(57) ABSTRACT

A method of detecting a state of charge of a battery, can include: obtaining an open circuit voltage in a present cycle according to an open circuit voltage of a previous cycle, a battery internal resistance of the previous cycle, and a battery capacitance of the previous cycle, where the battery internal resistance and the battery capacitance are updated according to the state of charge of the battery; and determining the state of charge of the battery according to the open circuit voltage in the present cycle.

20 Claims, 7 Drawing Sheets

(56) References Cited

U.S. PATENT DOCUMENTS

| | | | |
|---|---|---|---|
| 7,190,171 B2* | 3/2007 | Kawakami | H01M 10/46 324/430 |
| 7,406,389 B2 | 7/2008 | Emori et al. | |
| 8,084,996 B2 | 12/2011 | Zhang et al. | |
| 8,447,544 B2 | 5/2013 | Hsu et al. | |
| 9,321,368 B2* | 4/2016 | Yang | B60L 58/12 |
| 10,436,849 B2* | 10/2019 | Driemeyer-Franco | G01R 31/3648 |
| 2003/0169049 A1* | 9/2003 | Kawaguchi | B60L 58/10 324/426 |
| 2006/0046895 A1* | 3/2006 | Thacher | B60L 7/26 477/4 |
| 2007/0200567 A1* | 8/2007 | Mizuno | G01R 31/389 324/430 |
| 2007/0216407 A1* | 9/2007 | Yamaguchi | G01R 31/3648 324/256 |
| 2012/0105069 A1* | 5/2012 | Wang | G01R 31/392 324/427 |
| 2013/0138370 A1* | 5/2013 | Oh | G05B 11/01 702/63 |
| 2013/0166235 A1* | 6/2013 | Oh | G06F 17/13 702/63 |
| 2013/0300190 A1 | 11/2013 | Mao et al. | |
| 2014/0163910 A1 | 6/2014 | Yu et al. | |
| 2017/0324254 A1* | 11/2017 | Koch | G01R 31/3648 |
| 2018/0145524 A1* | 5/2018 | Chen | H02J 7/045 |

\* cited by examiner

METHOD AND APPARATUS FOR DETECTING STATE OF BATTERY

RELATED APPLICATIONS

This application claims the benefit of Chinese Patent Application No. 201610467536.3, filed on Jun. 23, 2016, which is incorporated herein by reference in its entirety.

FIELD OF THE INVENTION

The present invention generally relates to the field of power management, and more particularly to methods and apparatuses for detecting battery state.

BACKGROUND

Battery status detection is critical to the power management of portable devices and outdoor devices. For example, in the state of charge (SOC) of a battery (also known as residual power percentage), a typical battery-side voltage division approach may determine the state of charge of a corresponding battery according to the interval where the terminal voltage of the battery is found. This approach has a relatively simple structure, but the state of charge of the battery may not be precisely displayed, and the error can be somewhat large when the charge or discharge current is relatively large.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

The charging and discharging current of a battery can be sampled in real time, and the charge amount of the battery can be obtained by integrating. In one approach, the state of charge of the battery can be calculated based on the total charge amount and the charge amount variation of the battery. This approach may be referred to as the charge amount calculation method or the coulometric method, and can be relatively high in accuracy as to the high current charge and discharge measurements. However, when the charge and discharge current is relatively small, errors may be generated and accumulated due to measurement errors of an ampere meter. Because of the self-discharge phenomenon of a battery, the coulometer may not be able to calculate power consumption that is generated by very low and unmeasurable current.

In another approach, a battery model may be built, and an open circuit voltage (OCV) of a battery can be calculated based on the measurable battery parameters and the battery model. The state of charge can be obtained based on the relationship curve/table of the SOC-OCV (e.g., the state of charge versus open circuit voltage) of the battery. However, there are various types of open circuit voltage models, and simple models may not entirely represent the characteristics of the battery, while complex models may need to measure a large number of battery parameters, which can result in application difficulties.

In certain embodiments, a relatively simple battery model can be utilized in order to determine the current battery state according to historical battery parameters, and to constantly update an internal resistance and capacitance of the battery model based on the change of the state of charge. In this way, on the basis of the relatively simple model, effects on the power detection caused by the parameters that vary over time and the power variation can be substantially eliminated, in order to improve the accuracy of the state detection for the battery.

In one embodiment, a method of detecting a state of charge of a battery, can include: (i) obtaining an open circuit voltage in a present cycle according to an open circuit voltage of a previous cycle, a battery internal resistance of the previous cycle, and a battery capacitance of the previous cycle, where the battery internal resistance and the battery capacitance are updated according to the state of charge of the battery; and (ii) determining the state of charge of the battery according to the open circuit voltage in the present cycle.

Figure 1:
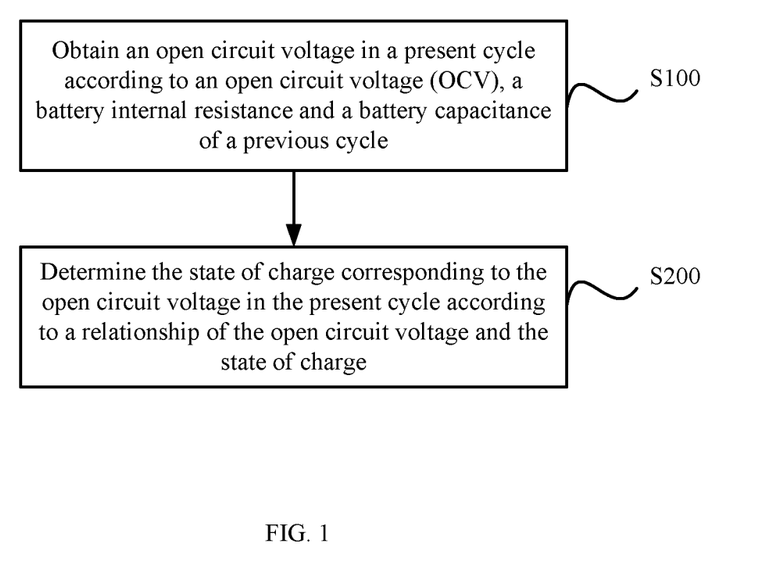
FIG. 1 is a flow diagram of an example method of battery state detection, in accordance with embodiments of the present invention.

Referring now to FIG. 1, shown is a flow diagram of an example method of battery state detection, in accordance with embodiments of the present invention. In this example, at S100, an open circuit voltage in the present cycle can be obtained according to an open circuit voltage (OCV) obtained in a previous cycle, and an internal resistance and capacitance of the previous cycle. Also, the internal resistance and capacitance of the battery may be updated according to the state of charge.

Figure 2:
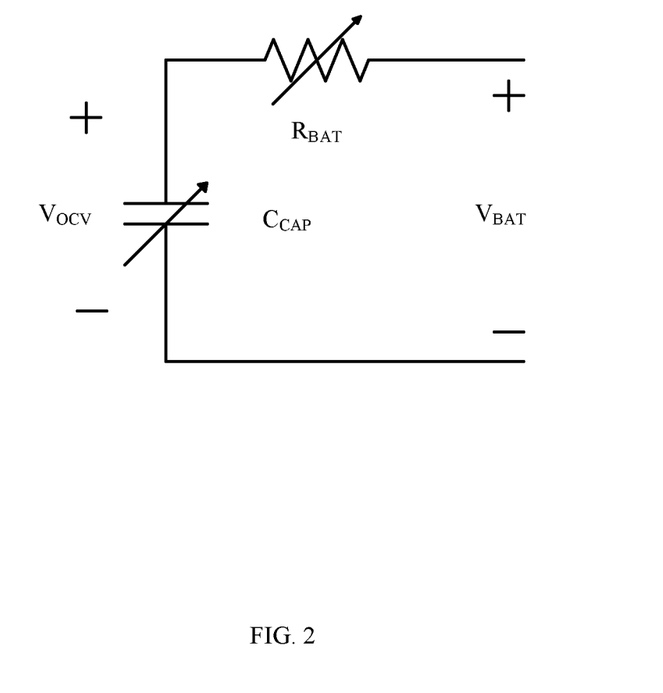
FIG. 2 is a schematic block diagram of an example battery model with open circuit voltage measurement, in accordance with embodiments of the present invention.

Referring also to FIG. 2, shown is a schematic block diagram of an example battery model with open circuit voltage measurement, in accordance with embodiments of the present invention. This particular example battery model can include capacitor $C_{CAP}$ and resistor $R_{BAT}$ coupled in series, and a voltage across capacitor $C_{CAP}$ is open circuit voltage $V_{OCV}$ of the battery. Also, a voltage between two terminals of the battery model is terminal voltage $V_{BAT}$. Resistor $R_{BAT}$ and capacitor $C_{CAP}$ change at least with the state of charge of the battery, and they may also be affected by various factors (e.g., the number of charge and discharge times, temperature, etc.). Relationships involved in the model of FIG. 2 can be represented according to the Kirchhoff's Voltage Law, as shown below in Equation 1:

$$V_{OCV} - R_{BAT} C_{CAP} \frac{dV_{OCV}}{dt} = V_{BAT} \quad (1)$$

Equation 1 can be discretized, as shown below in Equation 2:

$$V_{OCV}(k) - R_{BAT}(k-1) C_{CAP}(k-1) \frac{V_{OCV}(k) - V_{OCV}(k-1)}{T} = V_{BAT}(k) \quad (2)$$

Here, T is a detection cycle, $V_{OCV}(k)$ is the open circuit voltage in the present cycle, $V_{OCV}(k-1)$ is the open circuit voltage in the previous cycle, $R_{BAT}(k-1)$ is the internal resistance of the battery in the previous cycle, and $C_{CAP}(k-1)$ is the capacitance of the battery in the previous cycle. Open circuit voltage $V_{OCV}(k)$ in the present cycle can be calculated based on the above equation, as shown below in Equation 3:

$$V_{OCV}(k) = \frac{-V_{OCV}(k-1) R_{BAT}(k-1) C_{cap}(k-1) + V_{BAT}(k) \cdot T}{-R_{BAT}(k-1) C_{cap}(k-1) + T} \quad (3)$$

In this way, the open circuit voltage in the present cycle can be obtained according to the battery parameters in the previous cycle. One skilled in the art will recognize that the parameters obtained in the previous cycle are not strictly limited to the parameters obtained in the immediate cycle ahead the present cycle, and the relationship between the open circuit voltage and parameters in the previous N cycles can be obtained by discretizing in different ways according to the Kirchhoff's Voltage Law. For example, the relationship between the open circuit voltage and parameters in the previous N cycles can be obtained by discretizing into equations related to (K−2) or (K−3), and the calculation may be accordingly carried out.

In addition, the battery model may not be limited to the particular circuit model shown in FIG. 2, and the relationship between the open circuit voltage and the battery parameters can be built based on a more complicated circuit model. In this case, after discretization, the open circuit voltage of the battery in the present cycle can be obtained according to historical battery parameters. Further, even if the discretization is not performed, open circuit voltage $V_{OCV}$ in the present cycle can be obtained by calculating the change slope based on the historical data. At S200 in FIG. 1, the state of charge corresponding to the open circuit voltage in the present cycle can be determined according to the relationship of the open circuit voltage and the state of charge.

Figure 3:
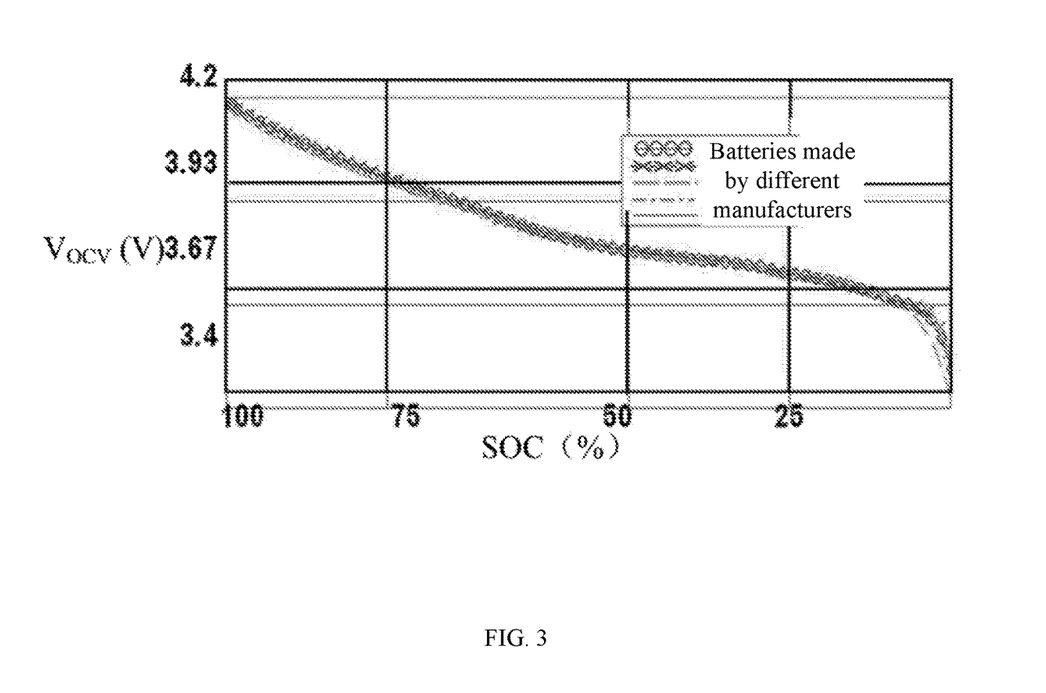
FIG. 3 is a curve diagram of an example OCV-SOC, in accordance with embodiments of the present invention.

Referring now to FIG. 3, shown is a curve diagram of an example OCV-SOC, in accordance with embodiments of the present invention. In this particular example, the open circuit voltage of the battery can decrease along with state of charge SOC, and several OCV-SOC curves of batteries made by different manufactures are shown. As can be seen, open circuit voltage $V_{OCV}$ corresponds to state of charge SOC. Thus, after the curve is measured in advance, the corresponding state of charge SOC can be obtained according to open circuit voltage $V_{OCV}$. Alternatively, the corresponding open circuit voltage can be obtained according to state of charge SOC.

As discussed above, internal resistance $R_{BAT}$ and capacitance $C_{CAP}$ can be updated according to the state of charge of the battery. In this particular example, internal resistance $R_{BAT}$ and capacitance $C_{CAP}$ can be updated in every detection cycle according to the variation of the state of charge of the battery. For the particular battery model of FIG. 2, open circuit voltage $V_{OCV}$ may be equal to the sum of terminal voltage $V_{BAT}$ and a voltage on the internal resistance (e.g., $V_{OCV}=V_{BAT}+I*R_{BAT}$), where I denotes a current flowing through the battery (e.g., I is the charge and discharge current). Thus, internal resistance $R_{BAT}(k-1)$ may be satisfied as shown below in Equation 4:

$$R_{BAT}(k-1) = \frac{V_{OCV}(k-1) - V_{BAT}(k-1)}{I(k-1)} \quad (4)$$

The battery current I and terminal voltage $V_{BAT}$ can be obtained by measuring the battery. Open circuit voltage $V_{OCV}$ can be obtained according to the SOC in the previous cycle by accessing a table that represents the relationship of OCV-SOC. That is, the state of charge in the previous cycle may initially be obtained, and then $V_{OVC}$ corresponding the state of charge can be obtained on the basis of the relationship of OCV-SOC. Further, the internal resistance in all previous cycles can be calculated in a similar fashion. That is, the internal resistance in the previous cycle may be calculated according to the terminal voltage, the charge and discharge current, and the open circuit voltage of the battery in the previous cycle. Also, the open circuit voltage may be obtained on the basis of the relationship of OCV-SOC and the state of charge in the previous cycle.

Figure 4:
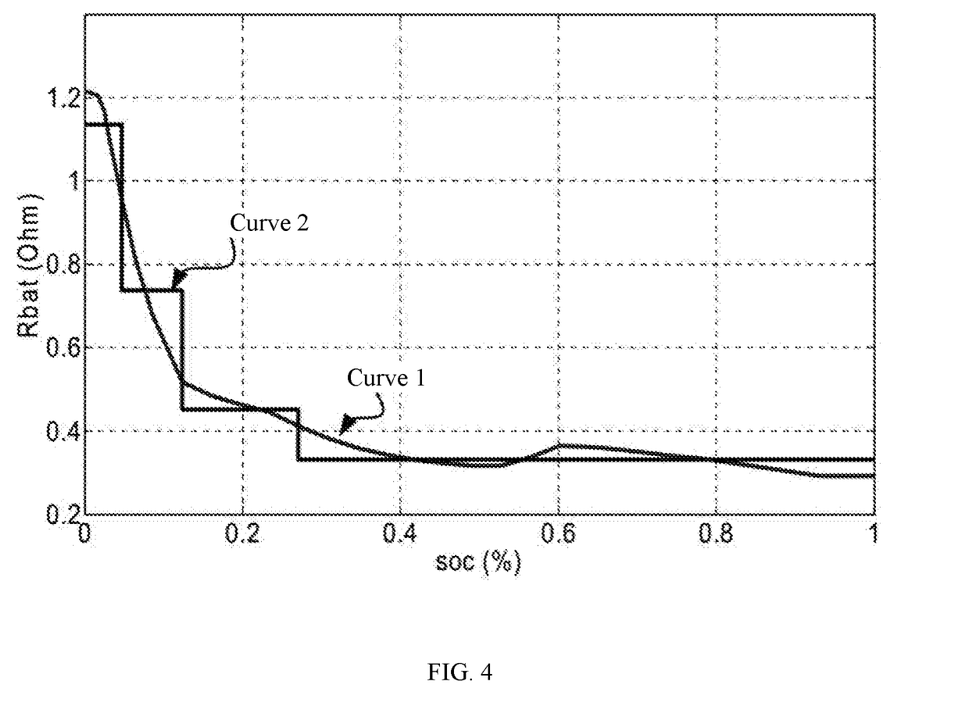
FIG. 4 is a curve diagram of an example internal resistance along with SOC of a model battery, in accordance with embodiments of the present invention.

Referring now to FIG. 4, shown is a curve diagram of an example internal resistance along with SOC of a model battery, in accordance with embodiments of the present invention. In this particular example, curve 1 shows that the internal resistance obtained in the above calculation approach gradually increases with the decrease of SOC. Curve 2 can be obtained by piecewise linearization of curve 1. Curve 2 may represent the relationship between the battery internal resistance and the state of charge of the battery in a one-to-one correspondence. Thus for example, the relationship between the state of charge of the battery and the battery internal resistance (e.g., curve 2 of FIG. 4) of a particular type of battery can be obtained by calculation or measurement in advance. Then, the battery internal resistance may be obtained based on the state of charge in the previous cycle. In this way, the calculation need not be carried out in each cycle, resulting in a reduction in computational efforts/circuitry.

In addition to the state of charge, the battery internal resistance may be affected by the number of battery charge and discharge times and/or temperature. Thus, the corresponding parameters can be introduced to compensate and correct the battery internal resistance, in order to obtain a more accurate estimation value of the battery internal resistance. In one example, the influence of the state of charge, the number of charge and discharge times, and the temperature on the internal resistance of the battery may be considered. That is, the internal resistance of the battery can be regarded as a function of the state of charge, the number of charge and discharge times, and the temperature.

Therefore, the estimation value of the battery internal resistance can be compensated according to the number of charge and discharge times of the battery after obtaining the preliminary estimation value of the battery internal resistance by calculation, or on the basis of the correspondence relationship of the charged state and the battery internal resistance. In one case, the number of charge and discharge times may be defined as the number of times that the unidirectional change amount of the charged state reaches 100%. For example, the battery can initially be charged to 80%, then discharged to 40%, and yet again charged to 60% from 40%, and the unidirectional change amount of the state of charge reaches 100% (e.g., 80% added to 20% in the charge direction. Thus, the number of charge and discharge times may increase by 1 in this particular example. Depending on the number of the battery charge and discharge times, different weighting coefficients may be used to compensate the estimation value of the battery internal resistance, as shown below in Table 1:

TABLE 1

| Cycles | ≤100 | 100 < cycles ≤ 200 | 200 < cycles ≤ 300 | 300 < cycles ≤ 400 | 400 < cycles |
|---|---|---|---|---|---|
| $R_{BAT}$ | K1* $R_{BAT}$ | K2* $R_{BAT}$ | K3* $R_{BAT}$ | K4* $R_{BAT}$ | K5* $R_{BAT}$ |

Here, K1-K5 can be obtained by test, or may be provided by battery manufacturers. One skilled in the art will recognize that the above compensation approaches are only examples, the estimation value of the battery internal resistance can be compensated by other compensation approaches on the basis of the usage time or number of times. The compensation for temperature may be made on the basis of following relationship, as shown below in Equation 5:

$$R_{BAT}(\text{Temp}) = R_{BAT}(\text{Temp1}) + (\text{Temp} - \text{Temp1}) \times m \times R_{BAT}(\text{Temp1}) \quad (5)$$

In this formula, $R_{BAT}(\text{Temp})$ may refer to the battery internal resistance when the temperature equals to Temp, $R_{BAT}(\text{Temp1})$ may refer to the battery internal resistance when the temperature equals to Temp1, and "m" is the temperature adjustment coefficient. The basic principle of the above formula for temperature compensation may utilize a resistance at a certain temperature as a reference, and regulate the resistance at other temperatures based on the reference resistance.

For example, the temperature compensation can be made before the compensation for the charge and discharge times. Thus, the compensation for the charge and discharge times can be made based on the battery internal resistance obtained after temperature compensation. For example, the temperature compensation can also be made after the compensation for the charge and discharge times. This can accurately compensate the impact on the battery internal resistance caused by the state of charge, temperature, and battery life, in order to ensure the estimation accuracy. Also, for the battery model example of FIG. 2, battery capacitor $C_{CAP}$ may satisfy the relationship, as shown below in Equation 6:

$$C_{CAP} = I \frac{dt}{dV_{OCV}} = I * \frac{T}{\Delta V_{OCV}} \quad (6)$$

Here, T represents the detection cycle, I represents the battery current (e.g., the charge and discharge current), and $\Delta V_{OCV}$ represents the change value of the open circuit voltage in a corresponding cycle, which can be obtained according to the change value of the state of charge on the basis of the correspondence relationship of the open circuit voltage and the state of charge. In this way, the battery capacitance in the corresponding cycle can be known by way of the historical data. As such, the battery capacitance in the previous cycle can be obtained according to the cycle length, the charge and discharge current, and the change value of the open circuit voltage in the corresponding cycle, and battery capacitance $C_{CAP}$ actually changes with the state of charge. Thus, similar to the battery internal resistance, the battery capacitance changing along with the state of charge can be determined by measurement or calculation in advance, in order to obtain the correspondence relationship of the state of charge and the battery capacitance. Also, the battery capacitance in the previous cycle can be directly obtained according to the state of charge in the previous cycle, and the correspondence relationship of the state of charge and the battery capacitor during the detection.

The battery capacitance can also be affected by the number of times the battery is used besides the state of charge, and the battery capacitance is less affected by the temperature and as such is negligible in this particular calculation. Therefore, the estimation value of the battery capacitance can be compensated according to the number of charge and discharge times after obtaining the preliminary estimation value of the battery capacitance by calculation or on the basis of the correspondence relationship of the state of charge and the battery capacitance.

In one example, the battery capacitance can be compensated as shown below in Table 2:

TABLE 2

| Cycles | ≤100 | 100 < cycles ≤ 200 | 200 < cycles ≤ 300 | 300 < cycles ≤ 400 | 400 < cycles |
|---|---|---|---|---|---|
| $C_{CAP}$ | K6* $C_{CAP}$ | K7* $C_{CAP}$ | K8* $C_{CAP}$ | K9* $C_{CAP}$ | K10* $C_{CAP}$ |

Here, K6-K10 can be obtained by test, or may be provided by battery manufacturers. Those skilled in the art will recognize that the above compensation approaches are only examples, and that the estimation value of the battery capacitance can be compensated by other approaches on the basis of the usage time or number of times.

Figure 5:
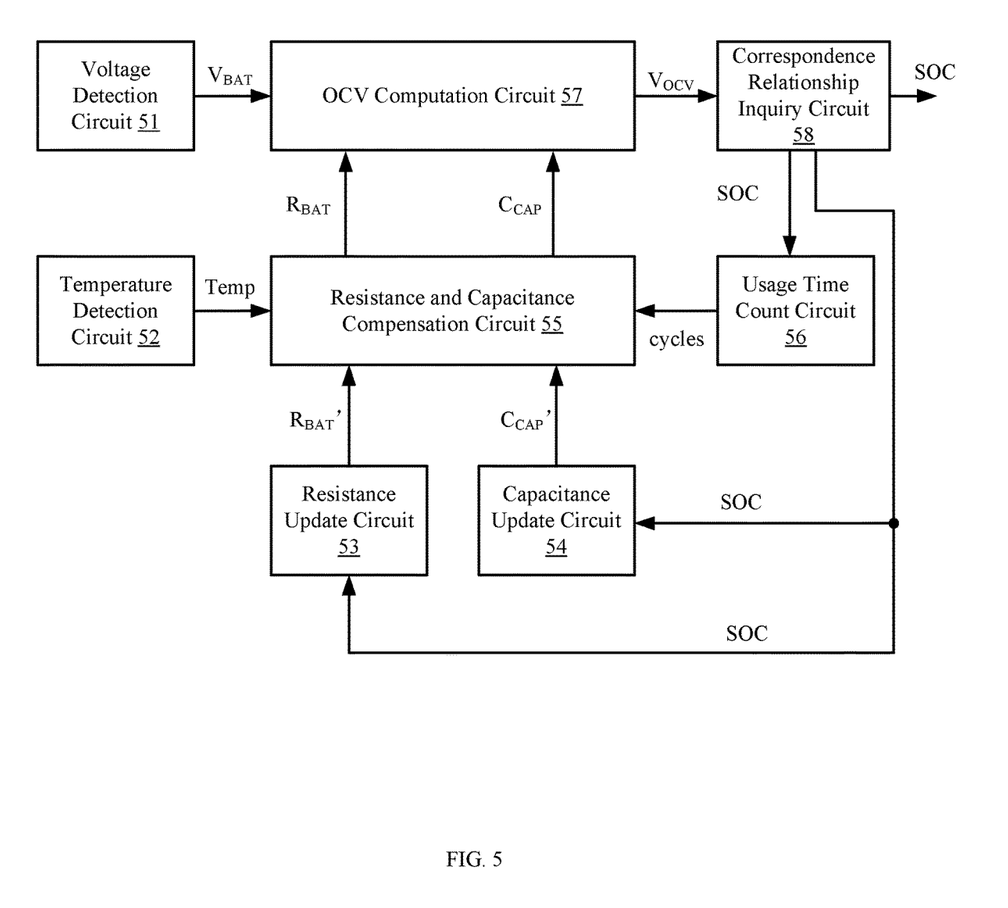
FIG. 5 is a schematic block diagram of an example battery state detector, in accordance with embodiments of the present invention.

Referring now to FIG. 5, shown is a schematic block diagram of an example battery state detector, in accordance with embodiments of the present invention. In this particular example, the estimation value of the battery internal resistance and the battery capacitance can be obtained by inquiring the preset correspondence relationship of the state of charge and the battery internal resistance, and the correspondence relationship of the state of charge and the battery capacitance. Voltage detection circuit 51 can detect terminal voltage $V_{BAT}$, and temperature detection circuit 52 can detect the temperature "Temp."

Resistance update circuit 53 can receive the state of charge SOC in the previous cycle, and may generate estimation value $R_{BAT}'$ of the battery internal resistance according to the preset correspondence relationship of the state of charge and the battery internal resistance. In addition, capacitance update circuit 54 can receive the state of charge SOC in the previous cycle, and may generate estimation value $C_{CAP}'$ of the battery capacitance according to the preset correspondence relationship of the state of charge and the battery capacitance. Resistance and capacitance compensation circuit 55 can compensate estimation value $R_{BAT}'$ of the battery internal resistance according to the temperature and the number of times "cycles" output by usage time count circuit 56, and may generate battery internal resistance $R_{BAT}$ after compensation.

Resistance and capacitance compensation circuit 55 can also compensate estimation value $C_{CAP}'$ of the battery capacitance according to the usage times, and may generate battery capacitance $C_{CAP}$ after compensation. OCV computation circuit 57 can generate open circuit voltage $V_{OCV}$ in the present cycle according to open circuit voltage OCV, the battery internal resistance, and the battery capacitance in the previous cycle. Correspondence relationship inquiry circuit 58 can generate the state of charge according to the open circuit voltage in the present cycle. The state of charge SOC may be provided to the usage time count circuit 56 in order to count the usage times.

By constantly updating the battery resistance and battery capacitance in the battery model based on the change of the charging state, it is possible to solve the influence on the parameters that vary with time and the change of the battery power on the basis of the relatively simple model, and to improve the accuracy of the battery state detection. In addition, particular embodiments are not limited to detection of the state of a single battery, but can also be applied to detect the state of a battery pack having a plurality of series and/or parallel coupled batteries.

Figure 6:
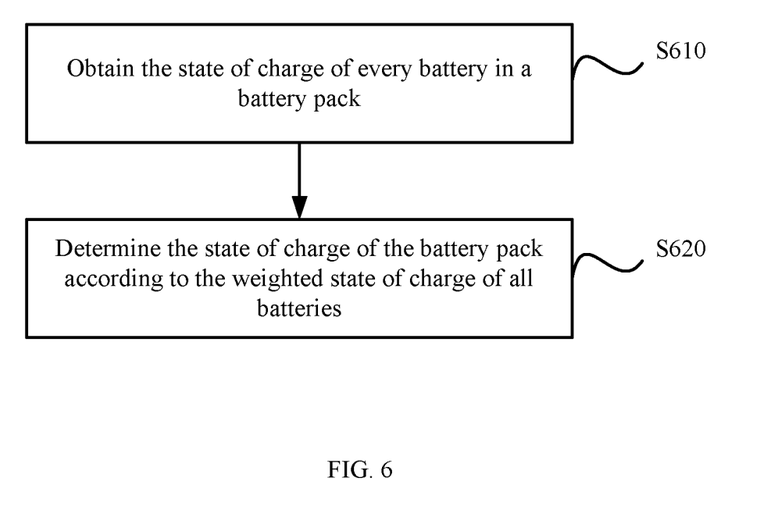
FIG. 6 is a flow diagram of an example battery state detection method for a battery pack, in accordance with embodiments of the present invention.

Referring now to FIG. 6, shown is a flow diagram of an example battery state detection method for a battery pack, in accordance with embodiments of the present invention. In this example, at S610, the state of charge of each battery in the battery pack can be obtained as described in the above examples. Each battery can be detected, and the estimation value of the state of charge may accurately represent the state of charge of each battery. At S620, the state of charge of the battery pack can be determined according to the weighted state of charge of all batteries in the battery pack. At S620, the states of charge of all of the batteries in the battery pack may be aggregated. For example, when the capacities of all the batteries in the battery pack are the same, the average calculation can be performed to determine the state of charge of the entire battery pack. In this way, the state of the entire battery pack can be determined.

Figure 7:
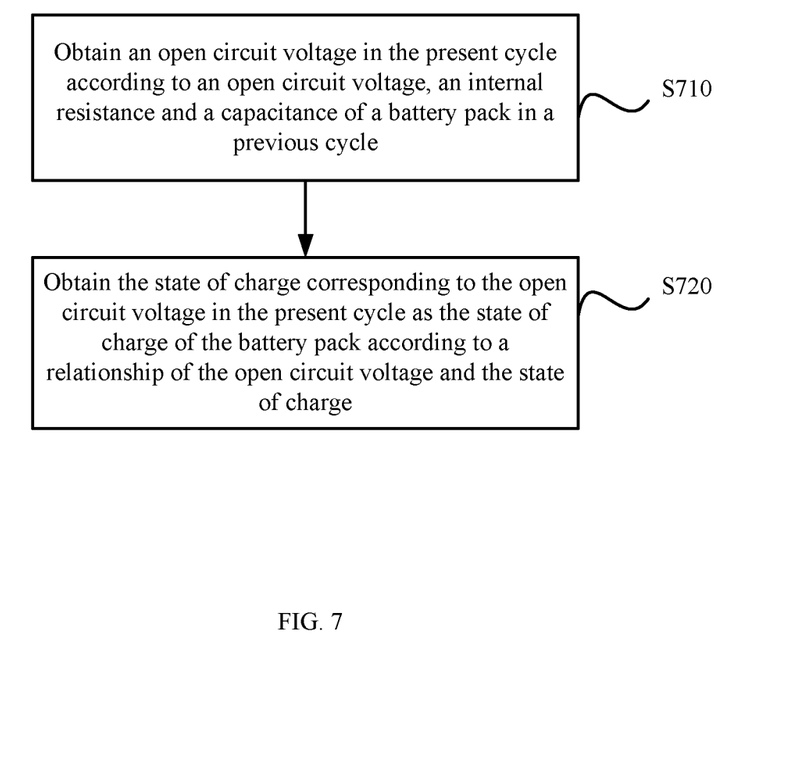
FIG. 7 is a flow diagram of another example battery state detection method for a battery pack, in accordance with embodiments of the present invention.

Referring now to FIG. 7, shown is a flow diagram of another example battery state detection method for a battery pack, in accordance with embodiments of the present invention. In this example, at S710, the open circuit voltage in the present cycle can be determined according to open circuit voltage $V_{OCV}$, the internal resistance of the battery pack, and the capacitance of the battery pack in the previous cycle. For example, the internal resistance and the capacitance of the battery pack may change along with the state of charge of the batteries, and can be updated according to the current and voltage of the battery pack.

When the battery pack is a series arranged battery pack, the current of the battery pack is the charge and discharge current of the battery pack, and the voltage of the battery pack is an average terminal voltage of the battery pack. When the battery pack is a parallel arranged battery pack, the current of the battery pack is the charge and discharge current of the battery pack, and the voltage of the battery pack is the terminal voltage of the battery pack. At S720, the state of charge of the battery pack can be determined corresponding to the open circuit voltage in the present cycle according to the relationship of the open circuit voltage and the state of charge.

In the particular example of FIG. 7, the entire battery pack may be detected as a single battery. When the battery pack is a series coupled battery pack, the terminal voltage of the battery pack can be averaged in order to obtain an average terminal voltage of the series coupled batteries in the battery pack to obtain the corresponding battery internal resistance and battery capacitance. When the battery pack is a parallel coupled battery pack, the total charge and discharge current of the battery pack can be averaged as a virtual charge and discharge current in order to obtain the corresponding battery internal resistance and battery capacitance. In this way, the computation and detection workloads can be reduced, and the state of charge of the entire battery pack can be directly determined.

By constantly updating the battery resistance and battery capacitance in the battery model based on the change of the charging state, it is possible to solve the influence on the parameters that vary with time and the change of the battery power on the basis of the simple model and to improve the state detection accuracy of the battery pack. Those skilled in the art will recognize that the detection approaches of the various batteries and battery packs as described herein can be applied in a general data processing equipment of a processor, in order to detect the state of charge.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A method of detecting a state of charge of a battery, the method comprising:
    a) determining an open circuit voltage during a present cycle according to an open circuit voltage of a previous cycle, a battery internal resistance of said previous cycle, and a battery capacitance of said previous cycle, wherein said battery internal resistance and said battery capacitance are constantly updated according to said state of charge of said battery; and
    b) determining said state of charge of said battery according to said open circuit voltage in said present cycle.

2. The method of claim 1, wherein said battery internal resistance and said battery capacitance are constantly updated in every detection cycle.

3. The method of claim 1, further comprising calculating said battery internal resistance of said previous cycle according to a terminal voltage, a charge and discharge current, and an open circuit voltage of said battery in said previous cycle.

4. The method of claim 3, further comprising compensating said battery internal resistance in said previous cycle using a number of charge and discharge times of said battery.

5. The method of claim 3, further comprising compensating said battery internal resistance in said previous cycle according to a temperature.

6. The method of claim 1, further comprising determining said battery internal resistance in said previous cycle according to said state of charge in said previous cycle.

7. The method of claim 6, further comprising compensating said battery internal resistance in said previous cycle using a number of charge and discharge times of said battery.

8. The method of claim 6, further comprising compensating said battery internal resistance in said previous cycle according to a temperature.

9. The method of claim 1, further comprising determining said battery capacitance in said previous cycle according to a cycle length, a charge and discharge current of said battery, and changes of said open circuit voltage in a corresponding cycle of said battery.

10. The method of claim 9, further comprising determining said changes of said open circuit voltage in said corresponding cycle according to changes of state of charge in said corresponding cycle.

11. The method of claim 1, further comprising determining said battery capacitance in said previous cycle according to said state of charge in said previous cycle.

12. The method of claim 11, further comprising compensating said battery capacitance in said previous cycle using a number of charge and discharge times of said battery.

13. The method of claim 1, further comprising:
a) detecting said state of charge of said battery for each of a plurality of batteries in a battery pack; and
b) determining a state of charge of said battery pack according to said detected state of charge of each battery.

14. The method of claim 13, wherein said plurality of batteries are coupled in series in said battery pack.

15. The method of claim 13, wherein said plurality of batteries are coupled in parallel in said battery pack.

16. A method of detecting a state of charge of a battery pack, the method comprising:
a) determining an open circuit voltage during a present cycle according to an open circuit voltage of a previous cycle, a battery pack internal resistance of said previous cycle, and a battery pack capacitance of said previous cycle, wherein said battery pack internal resistance and said battery pack capacitance are constantly updated according to said state of charge of said battery; and
b) determining said state of charge of said battery pack according to said open circuit voltage in said present cycle.

17. The method of claim 16, further comprising updating said internal resistance and said capacitance of said battery pack according to a current and a voltage of said battery pack.

18. The method of claim 17, wherein:
a) said battery pack comprises a plurality of batteries coupled in series;
b) said current of said battery pack is a charge and discharge current of said battery pack; and
c) said voltage is an average terminal voltage of said battery pack.

19. The method of claim 17, wherein:
a) said battery pack comprises a plurality of batteries coupled in parallel;
b) said current of said battery pack is an average charge and discharge current; and
c) said voltage is a terminal voltage of said battery pack.

20. A battery state detector, comprising:
a) an open circuit voltage computation circuit configured to determine an open circuit voltage during a present cycle according to an open circuit voltage of a previous cycle, an internal resistance of a battery of said previous cycle, and a capacitance of said battery of said previous cycle, wherein said battery internal resistance and said battery capacitance are constantly updated according to a state of charge of said battery; and
b) a correspondence relationship inquiry circuit configured to determine said state of charge of said battery according to said open circuit voltage in said present cycle.

* * * * *